(12) United States Patent
Sharma (10) Patent No.: US 8,834,231 B2
(45) Date of Patent: Sep. 16, 2014

(54) METHOD AND SYSTEM FOR REMOVING CONTAMINANTS

(76) Inventor: Sandeep Sharma, Singapore (SG)

( * ) Notice: Subject to any disclaimer, the term of this patent is extended or adjusted under 35 U.S.C. 154(b) by 593 days.

(21) Appl. No.: 13/055,750

(22) PCT Filed: Jul. 25, 2008

(86) PCT No.: PCT/SG2008/000274
§ 371 (c)(1),
(2), (4) Date: Apr. 8, 2011

(87) PCT Pub. No.: WO2010/011183
PCT Pub. Date: Jan. 28, 2010

(65) Prior Publication Data
US 2012/0094581 A1   Apr. 19, 2012

(51) Int. Cl.
*B24C 3/04* (2006.01)
(52) U.S. Cl.
USPC .................................. 451/38; 451/89; 451/88

(58) Field of Classification Search
USPC ................ 451/38, 39, 40, 76, 75, 87, 88, 102
See application file for complete search history.

(56) References Cited

U.S. PATENT DOCUMENTS

| | | | | |
|---|---|---|---|---|
| 5,766,368 A | * | 6/1998 | Bowers | 134/6 |
| 5,782,253 A | * | 7/1998 | Cates et al. | 134/7 |
| 5,932,026 A | * | 8/1999 | Trampusch | 134/7 |
| 6,960,119 B1 | * | 11/2005 | Said | 451/39 |

* cited by examiner

*Primary Examiner* — Robert Rose (57) ABSTRACT

A method and apparatus for removing contaminants from at least one portion of a semiconductor mold are disclosed. A nozzle is positioned at a preset position with respect to the portion of the semiconductor mold. Solid particles of a material that sublimes instantaneously along with at least one of the abrasives and additives are blasted at a predefined temperature and/or pressure over the portion, through the nozzle. On impact, the particles remove the contaminants from the portion of the semiconductor mold.

9 Claims, 11 Drawing Sheets

FIG. 11

METHOD AND SYSTEM FOR REMOVING CONTAMINANTS

CROSS-REFERENCE TO RELATED APPLICATIONS

This application is an U.S. national phase application under 35 U.S.C.§371 based upon co-pending International Application No. PCT/SG2008/000274 filed on Jul. 25, 2008. Additionally, this U.S. national phase application claims the benefit of priority of co-pending International Application No. PCT/SG2008/000274 filed on Jul. 25, 2008. The entire disclosures of the prior applications are incorporated herein by reference.

BACKGROUND

The present invention relates, in general, to removing contaminants. More specifically, the present invention relates to a method and apparatus for removing contaminants from a semiconductor mold through sublimable particles.

Semiconductor encapsulation molds are typically used to encapsulate semiconductor packages. This is typically accomplished by transfer molding thermosetting plastic compositions to form the semiconductor packages. In addition to traditional epoxy resins, new resin compositions, named 'green compounds', have been introduced as alternatives. The green compounds are chosen over the traditional resins, as they do not contain halogens and are eco-friendly. In comparison to the traditional resins, the green compounds are stickier, and cause sticking to the mold surface and staining of packages so formed. This leads to the formation of stresses in the internal parts of the molded packages during ejection from the mold surface. This, in turn, reduces the strength of the molded package. This eventually gives rise to quality and reliability issues, such as chip crack, micro crack, moisture seepage, etc. In order to achieve higher molding quality, the encapsulation molds are required to be cleaned frequently to get rid of the oxidized release agents and any other contaminants. Moreover, the frequency of cleaning required for the green compound is more than thrice that for the traditional resins.

Various techniques, such as scraping, media blasting, melamine cleaning, rubber cleaning, plasma cleaning, laser cleaning and chemical cleaning, have been employed for removing contaminants from a base surface of a mold. However, each of these techniques suffers from one or more disadvantages. Some of these techniques are not very delicate and can often cause damage to the base surface. In other cases, thin flashes and burrs are left on the base surface, thereby creating defects in the mold. In certain techniques, the mold has to be taken out from a machine on which the mold was mounted, and has to be disassembled and cleaned part-by-part. Removing and remounting the mold back onto the machine take a lot of time and fine tuning, thereby leading to wastage of time. Some of these techniques involve spillage of media particles that needs to be removed properly from various parts of the mold, so that the mold can be assembled precisely. Any leftover particle may cause inaccurate assembling of the parts, thereby damaging the mold when put to use. Most of these techniques produce a huge amount of waste products that are not eco-friendly. Disposal of these waste products is another hassle. Some of these techniques include an outgassing process, which produces fumes that pollute semiconductor materials being used for molding and a clean work environment.

In light of the foregoing discussion, there is a need for a method and apparatus for removing contaminants from a semiconductor mold that does not damage the semiconductor mold, can be performed inline, reduces the time required to clean, and reduces ecologically unfriendly waste.

SUMMARY

An object of the present invention is to provide a method and apparatus for removing contaminants from at least one portion of a semiconductor mold.

Another object of the present invention is to provide a method and apparatus for removing contaminants from at least one portion of a semiconductor mold that does not damage the semiconductor mold.

Yet another object of the present invention is to provide a method and apparatus for removing contaminants from at least one portion of a semiconductor mold that can be performed inline, thereby reducing the time required to clean.

Still another object of the present invention is to provide a method and apparatus for removing contaminants from at least one portion of a semiconductor mold that reduces ecologically unfriendly waste.

Embodiments of the present invention provide a method and apparatus for removing contaminants from at least one portion of a semiconductor mold. The apparatus includes a nozzle positioned at a preset position with respect to the portion of the semiconductor mold, and a blasting unit for blasting one or more of abrasives, gases and dry-ice particles at a predefined temperature and/or pressure over the portion, through the nozzle. On impact, the particles sublime instantaneously, transform into a gas, and remove the contaminants from the portion of the semiconductor mold. The one or more abrasives that are used in the present invention include, but are not limited to, naturally occurring abrasives such as Walnut shell dust, Calcite, Emery, Diamond dust, Novaculite, Pumice dust, Rouge, sand, abrasive mineral like Zirconia alumina and artificial abrasives such as Borazon, Ceramic, Ceramic aluminum oxide, Ceramic iron oxide, Corundum, Glass powder, Steel abrasive and dry-ice.

In accordance with an embodiment of the present invention, one or more additives are added to at least one of the gases, abrasive and dry-ice. The one or more additives are also applied to the portion of the semiconductor mold whose contaminants are to be removed. The addition of one or more additives to the abrasives, dry-ice and/or the portion of the semiconductor mold will enable prevention of contaminant adhesion to the surface of the portion of the semiconductor mold.

The one or more additives that are added to the abrasives and the dry-ice particles include but are not limited to wax, lubricants and releasing agents.

In a further embodiment of the present invention, the removal of contaminants from the two different semiconductor molds simultaneously is done with the use of a Y-shaped or a T-shaped nozzle.

In accordance with an embodiment of the present invention, the apparatus includes a blasting-unit regulator for controlling at least one of: the size and/or shape of the particles, a flow rate at which the particles are blasted, and a material-to-carrier ratio of the amount of the material to the amount of a carrier.

In an embodiment of the present invention, the apparatus includes a nozzle-control unit. The nozzle-control unit is used to set a position and/or movement of the nozzle. The nozzle-control unit controls the movement of the nozzle in an automated manner. The nozzle-control unit positions the nozzle at the preset position in an automated manner.

In an embodiment of the present invention, the apparatus also includes an enclosure within which the particles are blasted over the portion, to avoid spillage of the contaminants removed from the portion. The enclosure contains the gases, the abrasives, the contaminants the level of noise generated during blasting. The enclosure assists in removing the contaminants from the surface of the semiconductor mold in a production environment.

In an embodiment of the present invention, the apparatus further includes a vacuum hose connected with a vacuum pump. The vacuum hose extracts contaminants removed from the portion through blasting and that are present in the enclosure, to dispose the contaminants without any spillage. In addition, the vacuum so created vents out the gas formed after sublimation.

In an embodiment of the present invention, the apparatus further includes a recycling unit comprising a recycler. The recycling unit recycles the gases and abrasives to be reused for removing the contaminants. The recycling unit thus enables wastage and the apparatus is eco-friendly.

DETAILED DESCRIPTION OF THE INVENTION

Embodiments of the present invention provide a method and apparatus for removing contaminants from at least one portion of a semiconductor mold. In the description herein for embodiments of the present invention, numerous specific details are provided, such as examples of components and/or mechanisms, to provide a thorough understanding of embodiments of the present invention. One skilled in the relevant art will recognize, however, that an embodiment of the present invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of the embodiments of the present invention.

A nozzle is positioned at a preset position with respect to the portion of the semiconductor mold. Solid particles of a material that sublimes instantaneously at a predefined temperature and/or pressure are blasted over the portion, through the nozzle. On impact, the particles remove the contaminants from the portion of the semiconductor mold.

Figure 1:
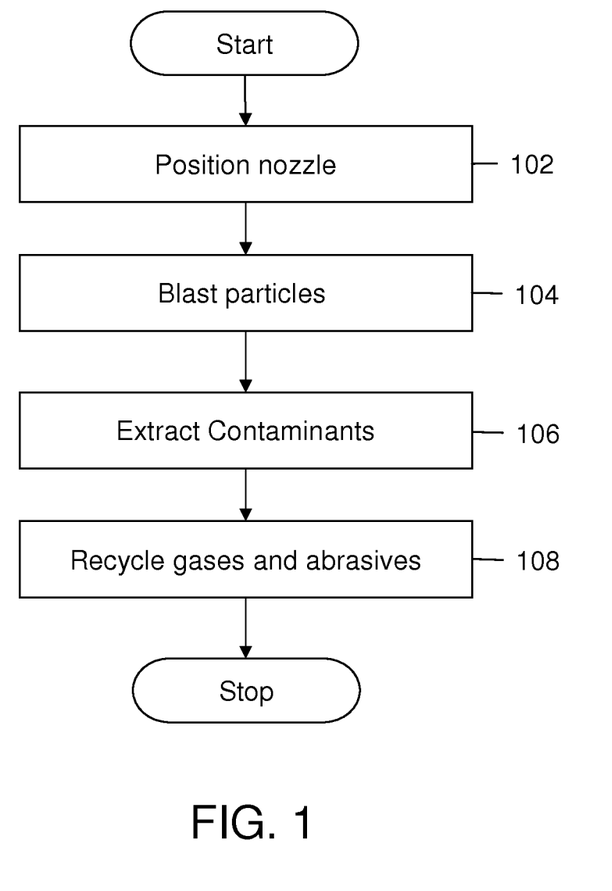
FIG. 1 is a flow diagram illustrating a method for removing contaminants from at least one portion of a semiconductor mold, in accordance with an embodiment of the present invention.

FIG. 1 is a flow diagram illustrating a method for removing contaminants from at least one portion of a semiconductor mold, in accordance with an embodiment of the present invention. The method is illustrated as a collection of steps in a logical flow diagram, which represents a sequence of steps that can be implemented in hardware, software, or a combination thereof.

At step 102, a nozzle is positioned at a preset position with respect to the portion of the semiconductor mold. A nozzle is defined as a projecting outlet through which any form of matter passes. The nozzle may be of any shape or size. The nozzle may, for example, be cylindrical, conical, bell-shaped, convergent-divergent or annular in shape. The shape of the nozzle may include, but not limited to, elliptical, circular, T-shaped, Y-shaped, one-way, two-way, multi-channeled or polygonal in cross-section.

Furthermore, the use of two-way nozzles that are Y-shaped and/or T-shaped enables the supply of the dry-ice particles in different directions. The two-way nozzle enables the removal of contaminants from the surface of the two semiconductor molds simultaneously. In another embodiment, the two-way nozzle enables the removal of contaminants from the parallel placed semiconductor molds simultaneously. In various embodiments of the present invention, the nozzle may have multiple outlets for blasting the particles on multiple semiconductor molds simultaneously.

At step 104, at least one of solid particles, such as dry-ice, abrasives and additives are blasted over the portion, through the nozzle. The solid particles is made of a material that sublimes instantaneously at a predefined temperature and/or pressure are blasted Examples of the material include, but are not limited to, solid carbon dioxide (often referred as dry-ice), solid iodine, camphor and solid naphthalene. Sublimation of a material is a transition of the material from the solid phase to the gaseous phase with no intermediate liquid phase. For a particular material, sublimation occurs at temperatures and/or pressures beyond the triple point of that material. Consider, for example, that dry-ice is used for blasting at step 104. The triple point of dry-ice is 216.55 Kelvin (i.e., −55.6 degree Celsius) and 517 kilo Pascal (i.e., 5.1 atmosphere). Therefore, dry-ice sublimes instantaneously under normal atmospheric conditions. Therefore, the predefined temperature and/or pressure can be selected based on the triple point of the material being used for blasting at step 104.

One or more abrasives are also added at step 104, wherein the one or more abrasives include, but are not limited to, naturally occurring abrasives such as Calcite, Emery, Diamond dust, Novaculite, Pumice dust, Rouge, sand, abrasive mineral like Zirconia alumina and artificial abrasives such as Borazon, Ceramic, Ceramic aluminum oxide, Ceramic iron oxide, Corundum, Glass powder, Steel abrasive and dry-ice.

Furthermore at step 104, one or more additives are added. The addition of one or more additives to at least one or more of gases, abrasives and dry-ice will enable easy removal of contaminant from the surface of the semiconductor mold. In first embodiment of the present invention, the additives and/or abrasives may be added prior to the blasting of solid particles (dry-ice). In second embodiment of the present invention, the additives and/or abrasives may be added after the blasting of solid particles (dry-ice). In third embodiment of the present invention, the additives and/or abrasives are added along with the blasting of solid particles (dry-ice).

The solid particles of the material may be of any shape and/or size. The solid particles may, for example, be in the form of grains, pellets, or powder. The solid particles are pressurized and accelerated with an incoming high-pressured carrier, to create a blast stream through the nozzle. A carrier is a medium through which the solid particles are carried through the nozzle to contaminated portions of the semiconductor mold. Compressed air may, for example, be used as the carrier.

On impact, the solid particles of the material transfer their kinetic energy to the contaminants, thereby knocking the contaminants off the portion of the semiconductor mold. In addition, instantaneous sublimation of these particles produces a micro-thermal shock, thereby cracking and de-laminating the contaminants. The extent of cracking and de-laminating of the contaminants depends on the thermal conductivity of the contaminants. Moreover, the sudden increase in the volume of the particles from the solid phase to the gaseous phase produces a micro explosion, which knocks the contaminants off the portion of the semiconductor mold.

At step 106, an extractor extracts the contaminants that are removed from the semiconductor mold. The contaminants are contained in an enclosure that prevents the escape of the noise, gases, abrasives and contaminants to the outer environment. The extractor draws the contaminants, gases and abrasives from the enclosure through a pneumatic pump. In an embodiment of the present invention, the pneumatic pump used is a vacuum pump.

At step 108, one or more vacuum pumps transfer the contaminants, gases and abrasives to one or more recycler units. The recycler units include one or more dust collectors and one or more filters. The one or more filters filter the gases and abrasives thereby separating the contaminants from the gases and abrasives. The contaminants are collected in the one or more dust collectors and disposed off, while the gases and abrasives are recycled for removing the contaminants.

In accordance with an embodiment of the present invention, the semiconductor mold is within a semiconductor manufacturing unit. A semiconductor manufacturing unit may, for example, be an assemblage of various machinery parts used to manufacture semiconductor devices. Examples of the portion of the semiconductor manufacturing unit include, but are not limited to, semiconductor encapsulation molds, press tools, Integrated Circuit (IC) test probes, trim/form punches/dies, ball attach tools, and other tools in electronics industry where resin, solder, tin or other contaminants are deposited.

Steps 102 to 108 may be performed inline with the semiconductor manufacturing unit, i.e., the various machinery parts of the semiconductor manufacturing unit need not be disassembled to perform steps 102 to 108 and the steps 102 to 108 may be performed in a production environment therefore eliminating the need for a separate unit for contaminant removal. Steps 102 to 108 may also be performed offline.

In accordance with another embodiment of the present invention, the semiconductor mold is a semiconductor device. Contaminants, such as resin, solder, tin, glue, oil, grease and dirt, may be removed from the semiconductor device. Examples of such semiconductor devices include, but are not limited to, semiconductor IC chips, Printed Circuit Boards (PCBs), semiconductor wafers, and flat panel displays. The semiconductor device may, for example, be in a bare, assembled or encapsulated form.

Figure 2:
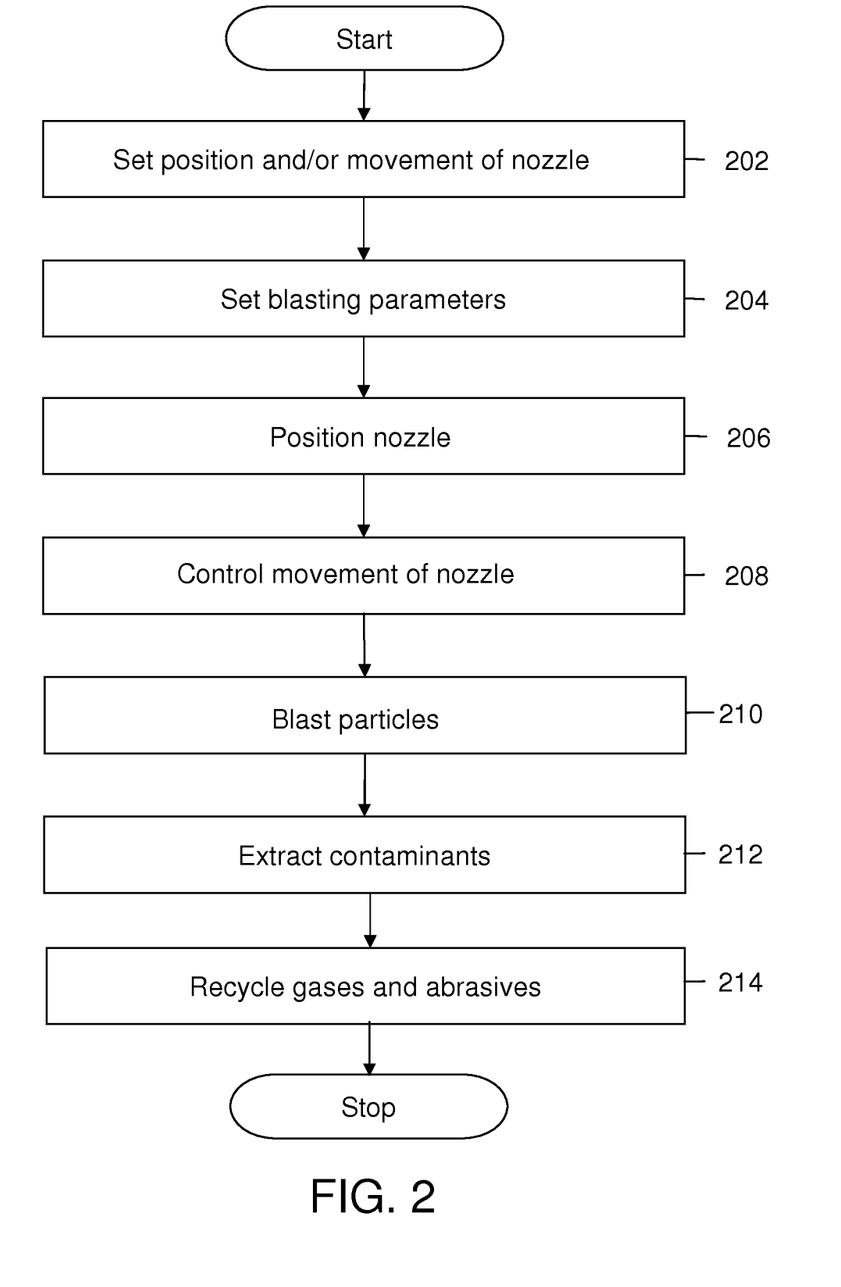
FIG. 2 is a flow diagram illustrating a method for removing contaminants from at least one portion of a semiconductor mold, in accordance with another embodiment of the present invention.

FIG. 2 is a flow diagram illustrating a method for removing contaminants from at least one portion of a semiconductor mold, in accordance with another embodiment of the present invention. The method is illustrated as a collection of steps in a logical flow diagram, which represents a sequence of steps that can be implemented in hardware, software, or a combination thereof.

At step 202, the position and/or movement of a nozzle is set with respect to the portion of the semiconductor mold. In an example, the position and/or movement of the nozzle may be set by using one or more pre-programmable instructions. For example, the position of the nozzle may be set at a distance from the portion of the semiconductor mold. The movement of the nozzle may be set in a horizontal and/or vertical direction, based on the surface and shape of the portion of the semiconductor mold. In addition, the movement of the nozzle may be set to cover the entire semiconductor mold. The nozzle has been explained in detail in conjunction with FIGS. 8, 9 and 10.

At step 204, one or more blasting parameters are set. The blasting parameters may, for example, include the shape and/or size of solid particles of a material that sublimes instantaneously at a predefined temperature and/or pressure, a flow rate at which the solid particles are to be blasted, and a material-to-carrier ratio. The material-to-carrier ratio is defined as the ratio of the amount of the material to the amount of the carrier. Details of these blasting parameters have been provided in conjunction with FIG. 4.

At step 206, the nozzle is placed at the position preset at step 202. In accordance with an embodiment of the present invention, the position of the nozzle may be regulated in an automated manner. In accordance with another embodiment of the present invention, the position of the nozzle may be regulated manually.

At step 208, the movement of the nozzle is controlled, as per the movement preset at step 202. In accordance with an embodiment of the present invention, the movement of the nozzle may be controlled in an automated manner. For example, the nozzle can be mounted on a series of motorized axes, thereby covering the entire portion to be cleaned. In accordance with another embodiment of the present invention, the movement of the nozzle may be controlled manually.

At step 210, the solid particles are blasted over the portion through the nozzle. As described earlier, sublimation occurs at temperatures and/or pressures beyond the triple point of the material. Therefore, the predefined temperature and/or pressure can be selected based on the triple point of the material being used for blasting, at step 210. In case of dry-ice, step 210 can be carried out at normal room temperatures and atmospheric conditions.

On impact, the solid particles of the material transfer their kinetic energy to the contaminants, thereby knocking the contaminants off the portion of the semiconductor mold. In addition, instantaneous sublimation of these particles produces a micro-thermal shock, thereby cracking and de-laminating the contaminants. Moreover, the sudden increase in the volume of the particles from the solid phase to the gaseous phase produces a micro explosion, which knocks the contaminants off the portion of the semiconductor mold.

At step 212, an extractor extracts at least one of the contaminants, gases, additives and abrasives from the portion of the semiconductor mold. The contaminants are contained in the enclosure that prevents the escape of the noise, gases, abrasives and contaminants to the outer environment. The extractor draws the contaminants, the gases and the abrasives from the enclosure through the vacuum pump.

At step 214, the vacuum pump transfers at least one of the contaminants, gases, additives and abrasives to the recycler. The recycler consists of a dust collector and one or more filters. The one or more filters filter the gases and abrasives thereby separating the contaminants from the gases and abrasives. The contaminants are collected in the dust collector and disposed off, while the gases and abrasives are recycled for removing the contaminants.

It should be noted here that steps 202-214 are only illustrative and other alternatives can also be provided where steps are added, one or more steps are removed, or one or more steps are provided in a different sequence without departing from the scope of the claims herein. For example, steps 208 and 210 may be performed simultaneously.

Figure 3:
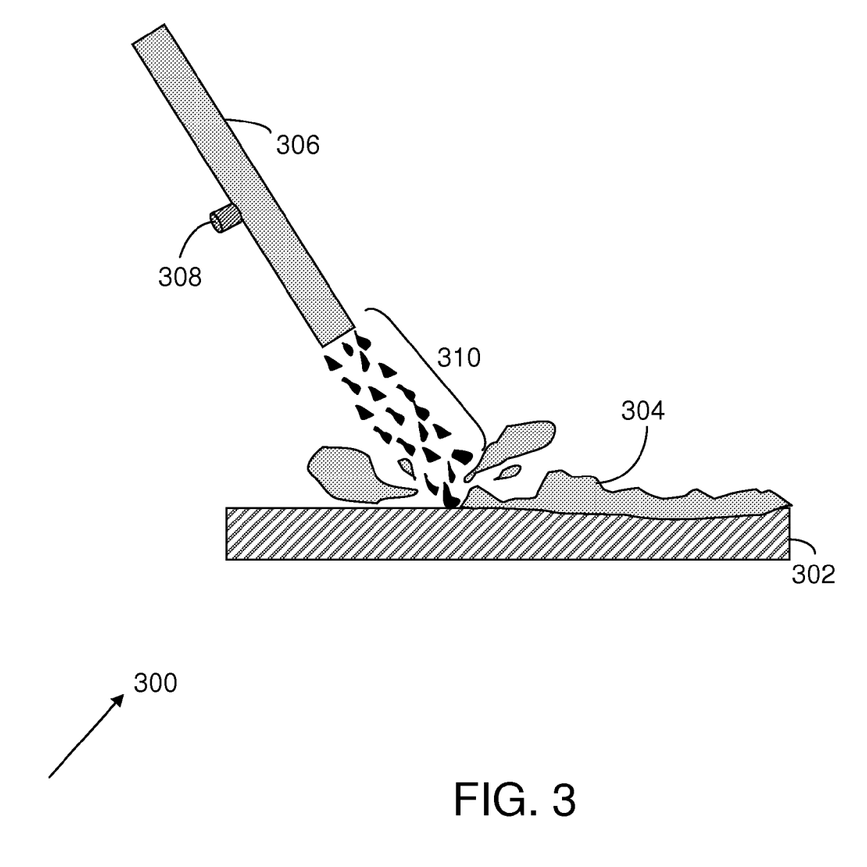
FIG. 3 is a schematic diagram illustrating a portion of an apparatus for removing contaminants from at least one portion of a semiconductor mold, in accordance with an embodiment of the present invention.

FIG. 3 is a schematic diagram illustrating a portion of an apparatus for removing contaminants, in accordance with an embodiment of the present invention. FIG. 3 shows a schematic diagram 300 illustrating at least one portion 302 of the semiconductor mold, contaminants 304 formed over the portion 302, a nozzle 306, a nozzle-control unit 308, and solid particle 310 of a material that sublimes instantaneously at a predefined temperature and/or pressure.

The nozzle 306 is placed at a preset position with respect to the portion 302 of the semiconductor mold. The nozzle-control unit 308 is used to set the position and/or movement of the nozzle 306. The nozzle-control unit 308 positions the nozzle 306 at the preset position, and controls the movement of the nozzle 306 in an automated manner, in accordance with an embodiment of the present invention. In accordance with another embodiment of the present invention, the position and/or movement of the nozzle 306 are controlled manually.

Figure 4:
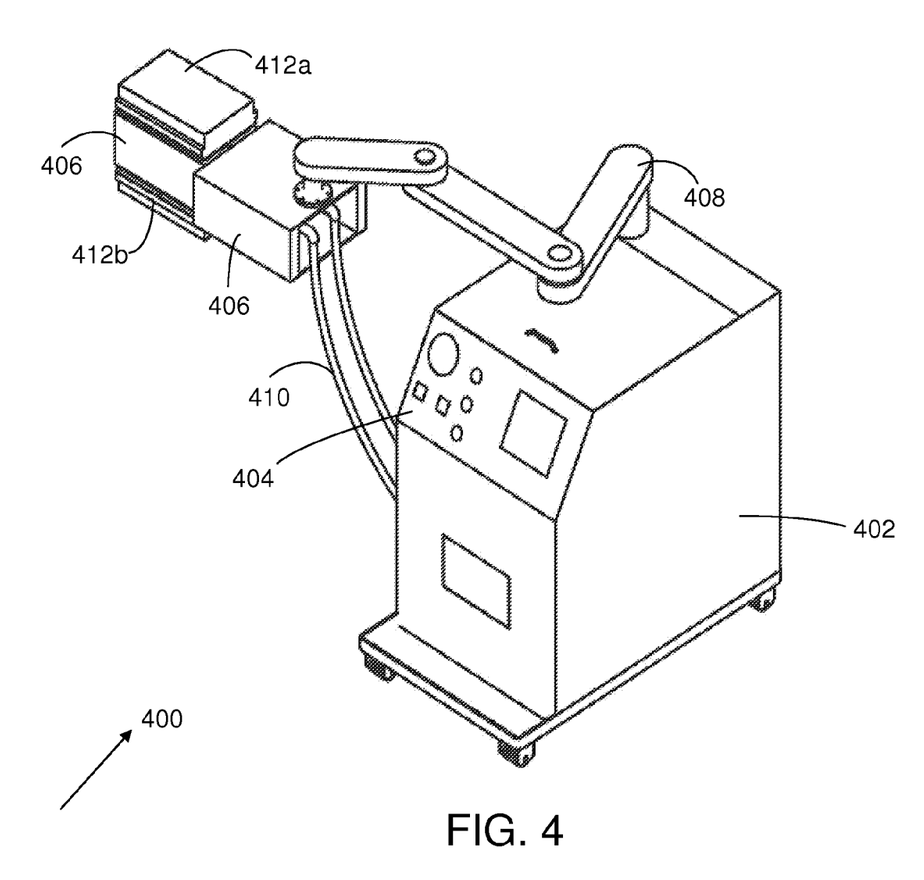
FIG. 4 is a perspective view of the apparatus, in accordance with an embodiment of the present invention.
Figure 5:
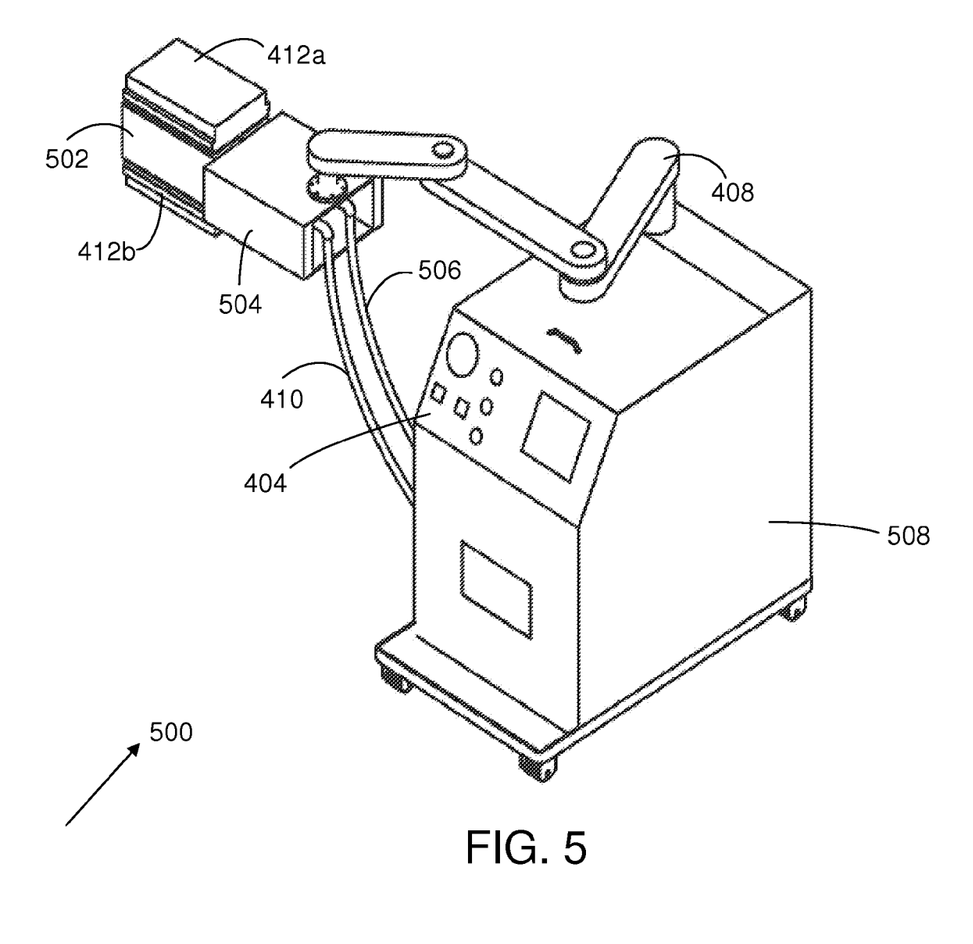
FIG. 5 is a perspective view of the apparatus, in accordance with an embodiment of the present invention.
Figure 8:
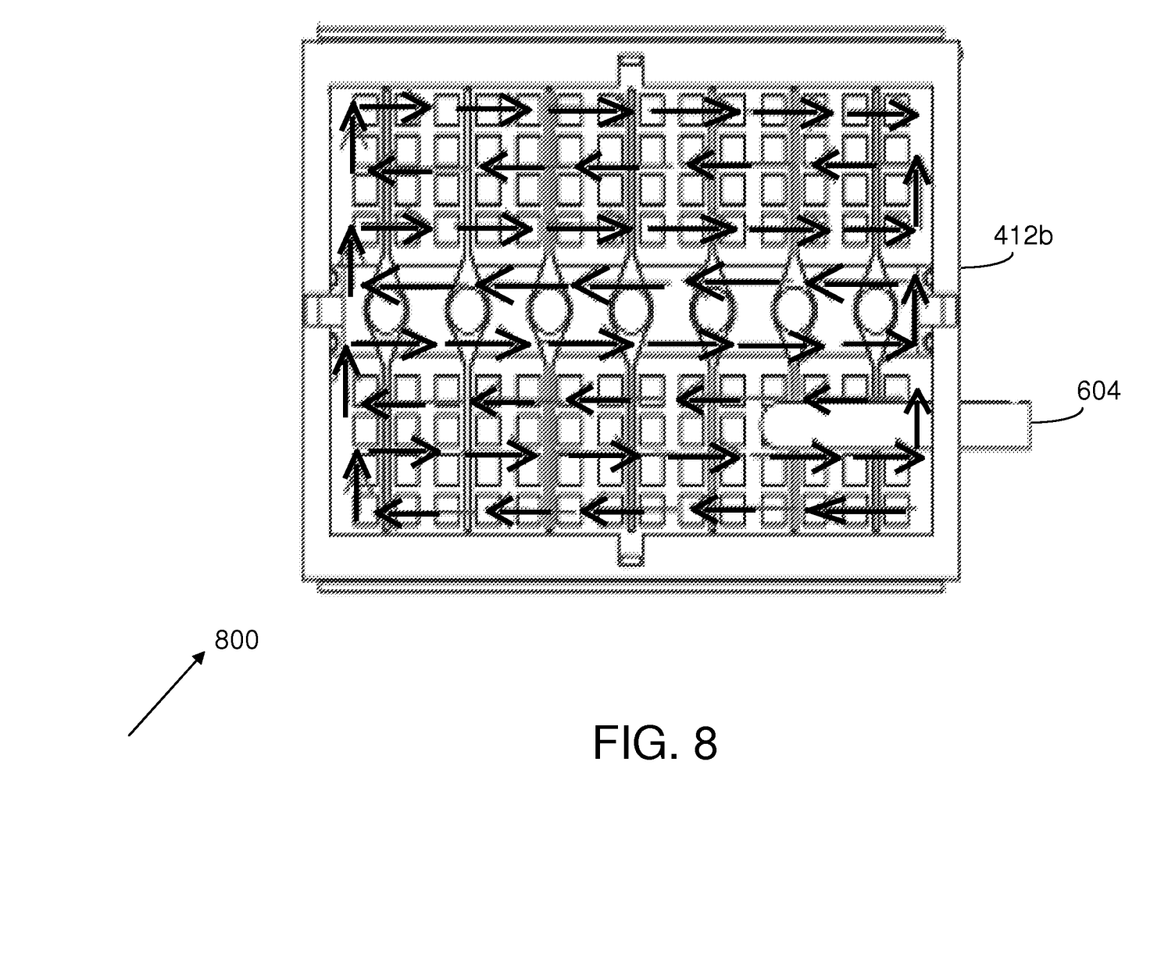
FIG. 8 is a top view illustrating the movement of the nozzle across the semiconductor mold, in accordance with an embodiment of the present invention.

The nozzle 306 is coupled to a blasting unit (Details of the blasting unit have been provided in conjunction with FIGS. 4, 5 and 8.). The solid particles 310 are blasted over the portion 302 of the semiconductor mold, through the nozzle 306, using the blasting unit. On impact, the solid particles 310 sublime instantaneously, and remove the contaminants 304 from the portion 302 of the semiconductor mold.

FIG. 4 is a perspective view of an apparatus 400 for removing contaminants from at least one portion of a semiconductor mold, in accordance with an embodiment of the present invention. The apparatus 400 includes a nozzle (not shown in FIG. 4), a nozzle-control unit (not shown in FIG. 4), a blasting unit 402, a blasting-unit regulator 404, an enclosure 406, a support frame 408, a vacuum pump (not shown in FIG. 4), and a vacuum hose 410. With reference to FIG. 4, the semiconductor mold includes an encapsulation mold, shown as an upper half 412a and a lower half 412b. In an embodiment of the present invention, the semiconductor mold includes multiple encapsulation molds.

The enclosure 406 encloses the inner molding portions of the encapsulation mold. Enclosure 406 has a height slightly smaller than the gap between the upper half 412a and the lower half 412b (often referred as the daylight of the encapsulation mold). The shape and size of the enclosure 406 may be chosen depending on machine constraints and work environment of the apparatus 400. The enclosure 406 may, for example, be made of any suitable material, such as aluminum, steel, leather, rubber and plastic.

The enclosure 406 has an inlet (not shown in FIG. 4) for allowing movement of the nozzle across various portions of the encapsulation mold. Support frame 408 provides support to enclosure 406.

The blasting-unit regulator 404 includes a plurality of regulators, such as a shape and size regulator to control the shape and/or size of solid particles of a suitable material, a flow-rate regulator to control the flow rate of the solid particles, a ratio regulator to control the material-to-carrier ratio, and other regulators for power supply, etc. The flow rate of the solid particles is set using the flow-rate regulator. The desired flow rate of the solid particles may vary according to the shape and size of the encapsulation mold, the shape and size of the solid particles, and the material-to-carrier ratio.

At least one of the solid particles, additives and abrasives along with gases are blasted over the portion of the encapsulation mold, through the nozzle, within the enclosure 406. The solid particles sublime instantaneously, transforming into a gas, thereby leaving no waste product. The contaminants removed from the portion of the encapsulation mold are contained within the enclosure 406, thereby avoiding any spillage. In addition, the enclosure 406 contains the level of noise generated during the process of blasting.

The vacuum hose 410 is connected with the vacuum pump, and is inserted in the enclosure 406 for extracting the contaminants contained within the enclosure 406. This ensures disposal of the contaminants, while avoiding any spillage. In addition, the vacuum so created in the enclosure 406 vents out the gas formed after sublimation. For example, in case of dry-ice, a solid particle of dry-ice expands approximately 700 times in volume at the time of sublimation.

The apparatus 400 may also include a camera (not shown in FIG. 4) that captures the state of the surface of the encapsulation mold before and after blasting. This enables the apparatus 400 and/or an operator of the apparatus 400 to decide whether the pattern of cleaning requires any modification. The pattern of cleaning maybe for example, defined by the position and/or movement of the nozzle and other blasting parameters, such as the shape and/or size of the solid particles, the flow rate and the material-to-carrier ratio.

The apparatus 400 is portable, and can be moved around a semiconductor manufacturing factory with ease. In addition, the apparatus 400 can be attached to any portion of the semiconductor manufacturing unit that requires cleaning. For example, the apparatus 400 may be used to clean die bond, wire bond, heating plate, flip chip, molds and presses, punches and dies, and test sockets and probes.

FIG. 5 is a perspective view of an apparatus 500 for removing the contaminants from at least one portion of a semiconductor mold, in accordance with another embodiment of the present invention. The apparatus 500 includes a nozzle (not shown in FIG. 5), a nozzle-control unit (not shown in FIG. 5), a semiconductor mold 502, the first encapsulation mold 412a, the second encapsulation mold 412b, a blasting unit 504, an inlet tube 506, the vacuum hose 410, the support frame 408, a blasting-unit regulator 404, a vacuum pump (not shown in FIG. 5) and recycler unit 508. With reference to FIG. 5, the semiconductor mold 502 is enclosed within the first encapsulation mold 412a and the second encapsulation mold 412b.

The blasting unit 504 blasts at least one of the dry-ice particles, abrasives and additives on the semiconductor mold 502. The blasting unit 504 functions similar to the blasting unit 402 but have been described in an alternative embodiment. The blasting unit 504 has been explained in detail in conjunction with FIG. 8 includes the nozzle (not shown in FIG. 5). The inlet tube 506 inputs the dry-ice particles and the abrasive to the nozzle for the removal of the contaminants from the semiconductor mold 502. The vacuum hose 410 removes the contaminants, abrasives and gases and transfers them to the recycler unit 508 for recycling. This ensures disposal of the contaminants, while avoiding any spillage. The support frame 408 provides support to the blasting unit 504.

In an embodiment of the invention, the recycler unit 508 includes one or more filters, one or more dust collectors and one or more recyclers. The one or more filters filter the gases and abrasives thereby separating the contaminants from them. The contaminants removed from the semiconductor mold 502 are collected in the one or more dust collectors and disposed off, while the gases and abrasives are recycled to be reused for removing the contaminants from further semiconductor molds. The blasting unit 402 and the blasting unit 504 will hereinafter referred to as the blasting unit 402.

In various embodiment of the present invention, the blasting unit 504, recycling unit 508, vacuum hose 410 and inlet tube 506 may be rearranged by a person skilled in the art such that they enable the removal of contaminants from the semiconductor mold.

Figure 6:
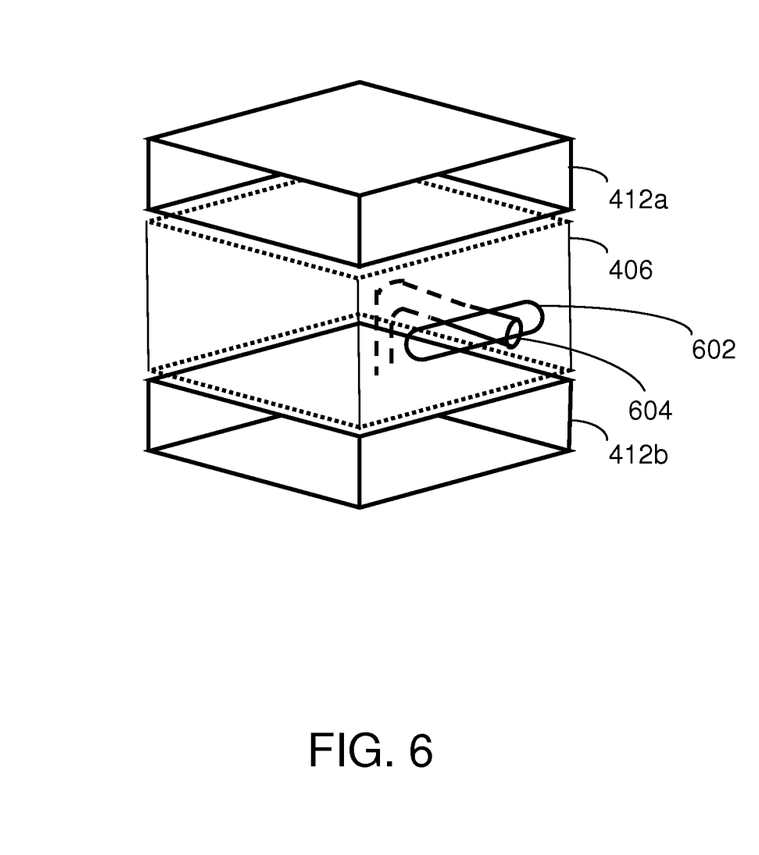
FIG. 6 is a perspective view of a portion of the apparatus, in accordance with an embodiment of the present invention.

FIG. 6 is a perspective view of a portion of the apparatus 400, in accordance with an embodiment of the present invention. The enclosure 406 includes an inlet 602 for allowing movement of a nozzle 604. The nozzle 604 may, for example, move in a horizontal, vertical, diagonal or zigzag manner.

Figure 7A:
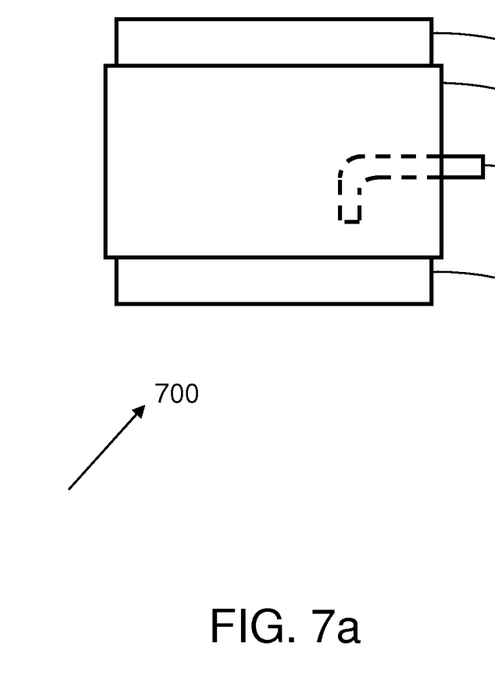
FIG. 7a is a cross-sectional view illustrating a position of a nozzle with respect to the portion of the semiconductor mold, in accordance with an embodiment of the present invention.

FIG. 7a is a cross-sectional view illustrating a position of the nozzle 604 with respect to the upper half 412a and the lower half 412b of the encapsulation mold, in accordance with an embodiment of the present invention. With reference to FIG. 7a, the nozzle 604 is positioned facing towards the lower half 412b of the encapsulation mold, within the enclosure 406.

Figure 7B:
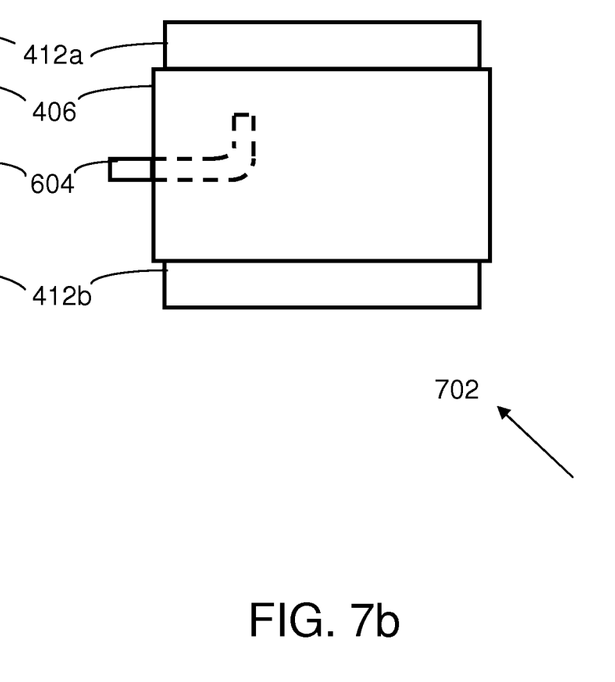
FIG. 7b is a cross-sectional view illustrating another position of the nozzle with respect to the portion of the semiconductor mold, in accordance with an embodiment of the present invention.

FIG. 7b is a cross-sectional view illustrating another position of the nozzle 604 with respect to the upper half 412a and the lower half 412b of the encapsulation mold, in accordance with an embodiment of the present invention. With reference to FIG. 6b, the nozzle 604 is positioned facing towards the upper half 412a of the encapsulation mold, within the enclosure 406.

It should be noted that the nozzle 604 may also be designed to target both the upper half 412a and the lower half 412b at the same time. Other suitable designs of the nozzle 604 should be apparent to those skilled in the relevant art.

FIG. 8 is a top-view illustrating the movement of the nozzle 604 across lower half 412b of the encapsulation mold, in accordance with an embodiment of the present invention. With reference to FIG. 8, the movement of the nozzle 604 is set to repeat from right to left and then left to right horizontally, till entire lower half 412b of the encapsulation mold is cleaned.

Figure 9:
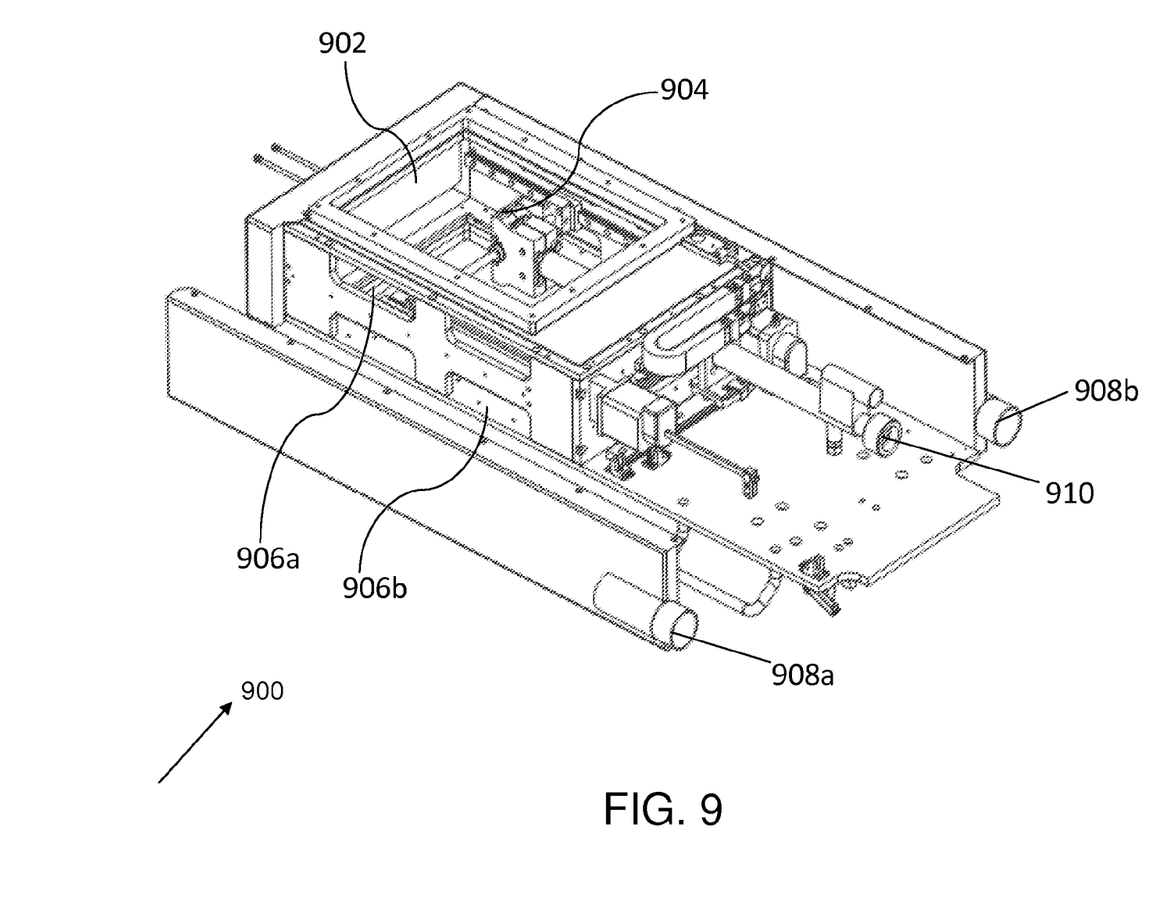
FIG. 9 is an inner view of the blasting unit illustrating various parts of the blasting unit, in accordance with an embodiment of the present invention.

FIG. 9 is an inner view 900 of the blasting unit 402, in accordance with an embodiment of the invention. The blasting unit 402 includes a controlled heater 902, a two-way nozzle 904, a first ventilation opening 906a, a second ventilation opening 906b, a first suction pipe 908a, a second suction pipe 908b and an inlet pipe 910.

With reference to FIG. 9, the controlled heater 902 heats the dry-ice particles after they impinge on the semiconductor mold. The heating of the dry-ice particles causes them to vaporize from the surface of the semiconductor mold. The two-way nozzle 904 is a Y-shaped nozzle. The two-way nozzle 904 enables the cleaning of the two semiconductor mold surfaces simultaneously. The first ventilation opening 906a and the second ventilation opening 906b are situated on the adjacent sides of the blasting unit 402 for enabling the cold gases inside the enclosure to pass through. The ventilation openings 906a and 906b prevents condensation of gases on the mold. In an embodiment of the present invention, the first ventilation opening 906a and the second ventilation opening 906b are situated at another location within the apparatus 400. The first suction pipe 908a and the second suction pipe 908b are connected to a vacuum pump (not shown in FIG. 9). The first suction pipe 908a and the second suction pipe 908b extract the contaminants, the spent gases, and the abrasives and convey them to a recycler (not shown in FIG. 9) for recycling. The inlet pipe 910 positioned above the two-way nozzle 904 enables the supply of at least one of the dry-ice particles, the additives and the abrasives for removing the contaminants from the semiconductor mold.

Figure 10A:
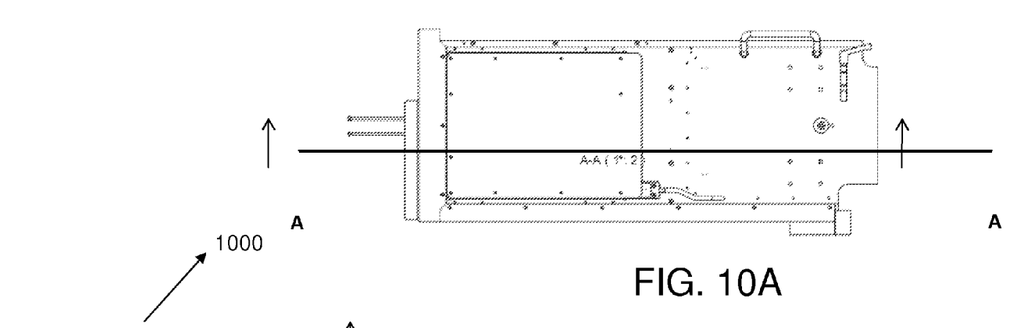
FIG. 10A is a sectional view of the blasting unit in accordance with an embodiment of the present invention.

FIG. 10A is a sectional view 1000 of the blasting unit 402 in accordance with an embodiment of the present invention. The section A-A of the blasting unit 402 denotes the area containing the two-way nozzle 904 which is explained in detail in conjunction with FIG. 10B.

Figure 10B:
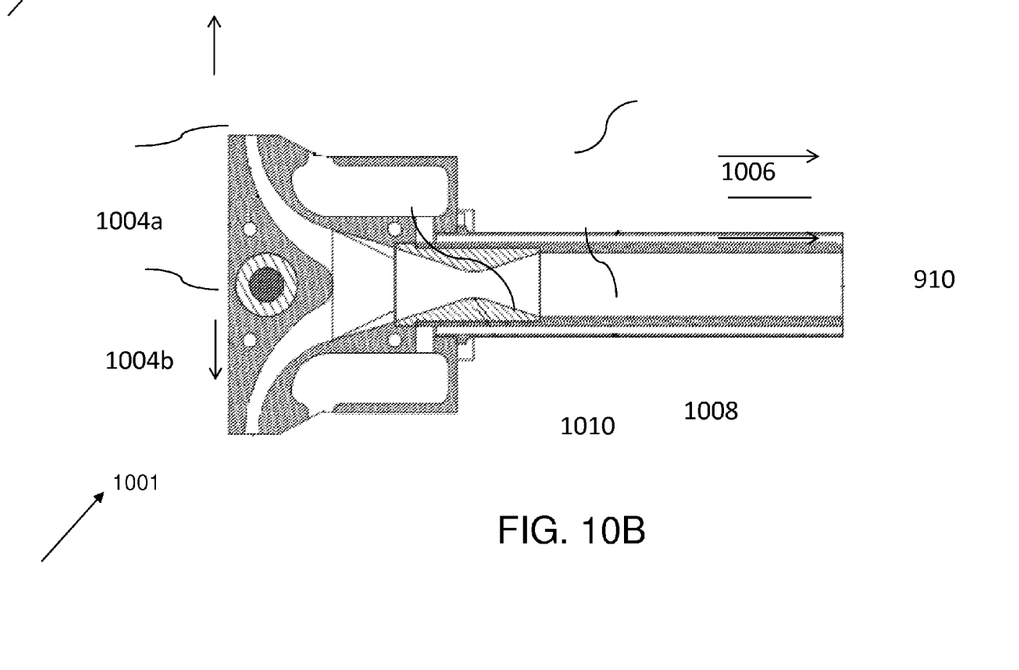
FIG. 10B is a cross-sectional view of the two-way nozzle in accordance with an embodiment of the present invention.

FIG. 10B is a cross-sectional view of the two-way nozzle 904, in accordance with an embodiment of the present invention. The cross-sectional view 1001 of the two-way nozzle 904 includes a first outlet 1004a, a second outlet 1004b, the inlet pipe 910, an outer pipe 1006, an inner pipe 1008 and a throat 1010.

With reference to FIG. 10B, the first outlet 1004a and the second outlet 1004b pump the dry-ice particles, additives and abrasives onto the semiconductor mold to remove the contaminants. The outer pipe 1006 and the inner pipe 1008 are coaxially stacked together to form the inlet pipe 910. Exhaust gases are let out through a gap between the outer pipe 1006 and the inner pipe 1008 which are held coaxially. The outer pipe 1006 acts as an insulator to the inner pipe 1008 which helps in maintaining the temperature of the inner pipe 1008. The throat 1010 on the inlet pipe 910 acts as a constricting element for the dry-ice particles and the abrasives. The throat 1010 streamlines the dry-ice particles and the abrasives on the semiconductor mold thereby making the removing of contaminants more efficient.

In various embodiments of the present invention, the nozzle may have multiple outlets that enable the blasting of particles in multiple directions. For example, the nozzle may have two, three or four outlets that enable blasting on two, three or four semiconductor mold simultaneously.

Figure 11:
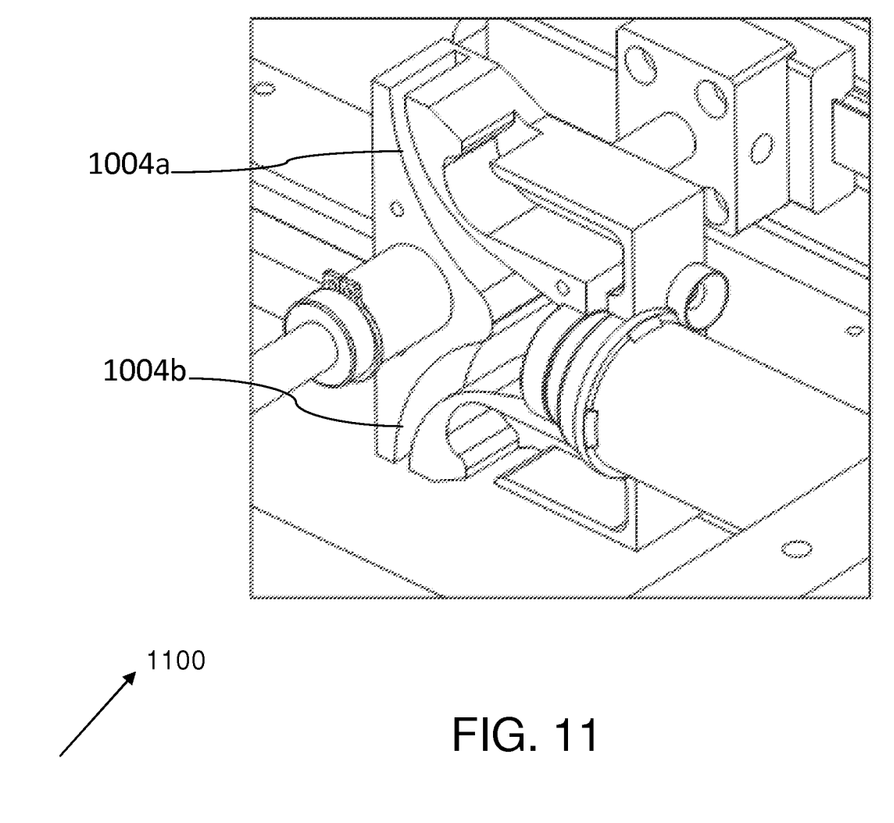
FIG. 11 is a perspective view of the nozzle in accordance with an embodiment of the present invention.

FIG. 11 is a perspective view 1100 of the two-way nozzle 904 in accordance with an embodiment of the present invention. The perspective view 1100 includes the first outlet 1004a and the second outlet 1004b. At least one of the dry-ice particles, additives and abrasives are pumped through the first outlet 1004a and the second outlet 1004b for removing the contaminants from the semiconductor mold.

Embodiments of the present invention provide a method and apparatus for removing contaminants from at least one portion of a semiconductor mold. Solid particles of a material that sublimes instantaneously under normal atmospheric conditions are blasted over the portion of the semiconductor mold. On impact, the particles transfer their kinetic energy to the contaminants, thereby knocking the contaminants off the portion of the semiconductor mold. In addition, instantaneous sublimation of these particles produces a micro-thermal shock, thereby cracking and de-laminating the contaminants. Moreover, the sudden increase in the volume of the particles from the solid phase to the gaseous phase produces a micro explosion, which knocks the contaminants off the portion of the semiconductor mold. The complete process of removal of contaminants occurs at a micro level, and therefore, does not damage the semiconductor mold.

In accordance with an embodiment of the present invention, the semiconductor mold is a semiconductor manufacturing unit, and the method is performed inline with the semiconductor manufacturing unit. This, in turn, reduces the time required to clean.

As the particles sublime instantaneously, no waste products are produced. In addition, an enclosure encloses the portion being cleaned, and therefore, avoids any spillage of the contaminants. The enclosure also contains the level of noise, the gases and the abrasives generated during blasting. The contaminants are also extracted through the vacuum hose, which ensures their disposal without any spillage. This reduces ecologically unfriendly waste.

This application may disclose several characteristic limitations that support any range within the disclosed features even though a precise feature limitation is not stated verbatim in the specification because the embodiments of the invention could be practiced throughout the disclosed features.

What is claimed is:

1. An apparatus for removing contaminants from at least one portion of a semiconductor mold inline, the apparatus comprising:
   a. a multi-exit nozzle positioned at a preset position with respect to the at least one portion;
   b. a blasting unit for blasting at least one of one or more abrasives, one or more additives and one or more dry-ice particles at a predefined temperature and pressure over the at least one portion, through the multi-exit nozzle, whereby the dry-ice particles produce an impact and remove the contaminants from the at least one portion of the semiconductor mold;
   c. a blasting-unit regulator for setting one or more blasting parameters, wherein said blasting parameters comprise at least one of: the size and shape of said particles, a flow rate at which said particles are blasted, and a material-to-carrier ratio of the amount of said material to the amount of a carrier;
   d. an enclosure for containing noise, contaminants, gases and abrasives;
   e. an extractor for extracting at least one of the contaminants, the gases and the abrasives from the enclosure;
   f. a recycler for recycling the gases and the abrasives to be reused for removing the contaminants from the at least one portion of the semiconductor mold;
   g. a vacuum pump; and
   h. a vacuum hose connected with said vacuum pump, wherein said vacuum hose sucks contaminants removed from said portion through blasting, to avoid spillage of said contaminants.

2. The apparatus of claim 1, wherein the multi-exit nozzle comprises of one or more openings for releasing at least one of the one or more abrasives, the one or more additives and the one or more dry-ice particles on one or more semiconductor mold.

3. The apparatus of claim 1 further comprising a nozzle-control unit for setting a position and movement of said multi-exit nozzle.

4. The apparatus of claim 1, wherein the nozzle-control unit positions the multi-exit nozzle at the preset position in an automated manner.

5. The apparatus of claim 1, wherein the semiconductor mold is a semiconductor device.

6. The apparatus of claim 1 further comprising a cleaning enclosure within which said particles are blasted over said portion, to avoid spillage of contaminants removed from said portion through blasting.

7. The apparatus of claim 1, wherein the blasting unit comprises:
   a controller heater to heat the one or more dry-ice particles to cause them to vaporize from the semiconductor mold;
   a two-way nozzle to clean two semiconductor molds simultaneously;
   first and second ventilation openings to enable cold gases inside the enclosure to pass through;
   first and suction pipes connected to the vacuum pump to extract the contaminants, gases and abrasives from the semiconductor mold; and
   an inlet pipe positioned above the two-way nozzle to enable supply of at least one of the dry-ice particles, additives and abrasives for removing contaminants from the semiconductor mold.

8. The apparatus of claim 1, wherein the blasting-unit regulator comprises:
   a shape and size regulator to control the shape and size of solid particles;
   a flow-rate regulator to control the flow rate of the particles, wherein the flow-rate depends on the size and shape of the semiconductor mold, shape and size of the particles and the material to carrier ratio; and
   a ratio regulator to control the material-to-carrier ratio.

9. The apparatus of claim 1, wherein the semiconductor mold includes an encapsulation mold divided into an upper half portion and a lower half portion, and wherein the enclosure has a height smaller than a gap between the upper half portion and the lower half portion.

* * * * *